US011221708B2

(12) United States Patent
Jonsson et al.

(10) Patent No.: US 11,221,708 B2
(45) Date of Patent: Jan. 11, 2022

(54) DIGITAL-TO-ANALOG CONTROLLER-REFERENCED TOUCH SENSING SYSTEM, AND RELATED SYSTEMS, METHODS, AND DEVICES

(71) Applicant: Microchip Technology Incorporated, Chandler, AZ (US)

(72) Inventors: Fredrik Jonsson, Gävle Gävleborg (SE); Richard P. Collins, Southampton (GB); Lionel Nicolas Portmann, Vaud (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/379,687

(22) Filed: Apr. 9, 2019

(65) Prior Publication Data
US 2020/0210016 A1 Jul. 2, 2020

Related U.S. Application Data

(60) Provisional application No. 62/785,141, filed on Dec. 26, 2018.

(51) Int. Cl.
*G06F 3/044* (2006.01)
*G06F 3/041* (2006.01)

(52) U.S. Cl.
CPC ............ *G06F 3/0416* (2013.01); *G06F 3/044* (2013.01)

(58) Field of Classification Search
CPC ............................. G06F 3/044; G06F 3/0416
USPC .................................................. 345/173–174
See application file for complete search history.

(56) References Cited

U.S. PATENT DOCUMENTS

2011/0012618 A1* 1/2011 Teterwak ............. G01D 5/2417
324/607
2012/0256870 A1* 10/2012 Klein .................... G06F 3/0446
345/174
2015/0091849 A1* 4/2015 Ludden ................. G06F 3/0412
345/174

(Continued)

FOREIGN PATENT DOCUMENTS

WO 2016/049425 A1 3/2016

OTHER PUBLICATIONS

Anonymous: "Direct digital synthesis—Wikipedia", Oct. 17, 2018, XP055666223, "https://en.wikipedia.org/w/index.php?title-Direct_digital_synthesis&oldid=864523777", Jul. 2, 2020.

(Continued)

*Primary Examiner* — Kwin Xie
(74) *Attorney, Agent, or Firm* — TraskBritt

(57) ABSTRACT

Some disclosed embodiments relate, generally, to shaping a waveform of a reference signal used by a driver of a touch sensor to limit electromagnetic emissions (EME) emitted by a touch sensor during a sensing operation. Some disclosed embodiments relate, generally, to a DAC referenced touch sensor driver and controlling an amount of EME emitted at a touch sensor using shapes of reference signals used by a touch detector to detect touches at the touch sensor. Some disclosed embodiments relate, generally, to compensating for effects of foreign noise at a touch sensor. And more specifically, to changing a shape of a reference signal based on a change to a sampling rate made to compensate for foreign noise.

28 Claims, 13 Drawing Sheets

(56) References Cited

U.S. PATENT DOCUMENTS

2015/0233998 A1* 8/2015 Chen .................... G01R 31/086
324/764.01
2020/0067495 A1* 2/2020 Roberson ............... H03K 5/003
2020/0097112 A1* 3/2020 Seo ..................... G06F 3/04166

OTHER PUBLICATIONS

Anonymous: "Numerically-controlled oscillator—Wikipedia", Oct. 17, 2018, XP055666226, "https://en.wikipedia.org/w/index.php?title=Numerically-controlled_oscillator&old id=864525314", Jul. 2, 2020.

International Search Report from International Application No. PCT/US2019/058233, dated Jun. 24, 2020, 8 pages.

International Written Opinion from International Application No. PCT/US2019/058233, dated Jun. 24, 2020, 19 pages.

* cited by examiner

DIGITAL-TO-ANALOG CONTROLLER-REFERENCED TOUCH SENSING SYSTEM, AND RELATED SYSTEMS, METHODS, AND DEVICES

CROSS-REFERENCE TO RELATED APPLICATIONS

This application claims priority to and the benefit of the filing date of U.S. Provisional Patent Application Ser. No. 62/785,141, filed Dec. 26, 2018, the entire contents and disclosure of which are hereby incorporated herein by this reference.

TECHNICAL FIELD

Systems, methods and devices of the present disclosure relate, generally, to capacitive touch sensing, and more particularly, some embodiments relate to techniques for improved electromagnetic emissions control in touch sensors.

BACKGROUND

A typical touch interface system may incorporate touch sensors (e.g., capacitive sensors and/or resistive sensors, without limitation) that respond to an object in close proximity to, or physical contact with, a contact sensitive surface of a touch interface system. Such responses may be captured and interpreted to infer information about the contact, including a location of an object relative to the touch interface system.

Touchpads used with personal computers, including laptop computers and keyboards for tablets, often incorporate or operate in conjunction with a touch interface system. Displays often include touch screens that incorporate elements (typically at least a touch sensor) of a touch interface system to enable a user to interact with a graphical user interface (GUI) and/or computer applications. Examples of devices that incorporate a touch display include portable media players, televisions, smart phones, tablet computers, personal computers, and wearables such as smart watches, just to name a few. Further, control panels for automobiles, appliances (e.g., an oven, refrigerator or laundry machine) security systems, automatic teller machines (ATMs), residential environmental control systems, and industrial equipment may incorporate touch interface systems with displays and housings, including to enable buttons, sliders, wheels, and other touch elements.

While touch sensors emit electromagnetic emissions (EME), such as electromagnetic fields and electromagnetic radiation, traditionally, designers of touch sensors have been primarily concerned with minimizing a touch sensor's susceptibility to EME from nearby devices. Touch sensors were in the past used in environments where EME limits were very forgiving. However, limits apply to touch sensors based on their function and the environment in which they are installed. The inventors of this disclosure appreciate that to meet the strict EME limits of new applications for touch sensors such as automotive applications, techniques and systems are needed to test, calibrate, and operate touch sensors.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 2:
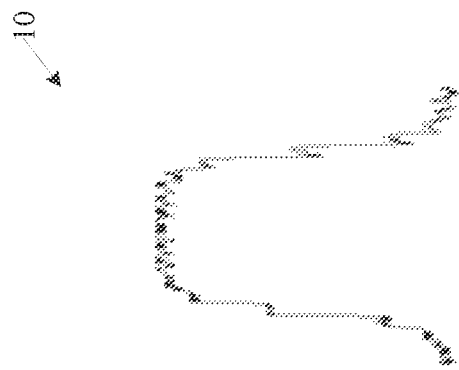
FIG. 2 shows an example square waveform that is a digital-to-analog-converter (DAC) approximation.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

It will be readily understood that the components of the embodiments as generally described herein and illustrated in the drawings may be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

Thus, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise a set of elements may comprise one or more elements. Likewise, sometimes elements referred to in the singular form may also include one or more instances of the element.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field-Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

Also, it is noted that the embodiments may be described in terms of a process that is depicted as a flowchart, a flow diagram, a structure diagram, or a block diagram. Although a flowchart may describe operational acts as a sequential process, many of these acts may be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

As understood for purposes of the embodiments described in this disclosure, a capacitive sensor may respond to an object's (such as a finger or a stylus) contact with, or the object's proximity to, a contact-sensitive area of the capacitive sensor. In this disclosure "contact" and "touch" are meant to encompass both an object's physical contact with a contact-sensitive area and an object's presence within proximity of a contact-sensitive area without physical contact. Actual physical contact with a capacitive sensor is not required.

When an object contacts a capacitive sensor, a change in capacitance may occur within the touch sensor at or near the location of the contact. An analog acquisition front-end may "detect" the touch if it meets a certain threshold. "Charge-then-transfer" is a technique implemented in some touch-acquisition front-ends to detect capacitive changes, whereby a sensing capacitor is charged responsive to the change in capacitance (e.g., charged faster or slower) and the charge is transferred to an integrating capacitor over multiple charge-transfer cycles. The amount of charge associated with such a charge-transfer may be converted to digital signals by an analog-to-digital converter (ADC), and a digital controller may process those digital signals to determine measurements and if an object contacted the sensor.

Self-capacitance sensors are capacitive field sensors that detect/respond to changes in capacitance to ground. They are typically laid out in an array of rows and columns that react independently to a touch. By way of non-limiting example, a self-capacitance sensor may include a circuit employing repetitive charge-then-transfer cycles using common integrated CMOS push-pull driver circuitry having floating terminals. Mutual capacitance sensors are capacitive field sensors that detect/respond to changes in capacitance between two electrodes: a drive electrode and a sense electrode. The drive electrode and sense electrode pairs at each intersection of drive and sense lines form a capacitor. Self-capacitance and mutual capacitance techniques may be used in the same touch interface, and complimentary to each other, for example, self-capacitance may be used to confirm a touch detected using a mutual capacitance.

Touch sensors may be overlaid in a 2-dimensional (2-D) arrangement for a 2-D contact sensitive surface that may be incorporated into a contact sensitive surface—for example, of a touch pad or a display screen—and may facilitate user interaction with an associated appliance. Insulating protective layers (e.g., resins, glass, plastic, etc.) may be used to cover touch sensors. As used herein, a "touch display" or "touch panel" is a display (such as a liquid crystal display (LCD), thin-film-transistor (TFT) LCD, or a light emitting diode (LED) display) that incorporates 2-D touch sensors.

Using the example of a touch screen that uses a matrix sensor approach of mutual capacitance sensors employing charge-transfer techniques, drive electrodes may extend in rows on one side of a substrate and sense electrodes may extend in columns on the other side of the substrate so as to define a "matrix" array of N by M nodes. Each node corresponds to an intersection between the electrically conductive lines of a drive electrode and of a sense electrode. A drive electrode simultaneously drives (i.e., provides an alternating current (A/C) stimulus) all of the nodes in a given row and a sense electrode senses all of the nodes in a given column. The capacitive coupling of the drive electrode and sense electrode at a node position may be separately measured or both measured in response to a capacitive change indicative of a touch event. For example, if a drive signal is applied to the drive electrode of row 2 and a sense electrode of column 3 is active then the node position is: (row 2, column 3). Nodes may be scanned by sequencing through different combinations of drive and sense electrodes. In one mode the drive electrodes may be driven sequentially while the sense electrodes are all continuously monitored. In another mode each sense electrode may be sampled sequentially.

Using the example of a touch screen that uses a matrix sensor approach of self-capacitance sensors, electrodes may extend in rows and columns to define a "matrix" array of N by M nodes. The matrix sensor may be constructed with an electrode at each node, each electrode being individually addressable, or each row and column may be an addressable electrode and each node corresponds to a unique row/column pair. A drive signal (i.e., an A/C stimulus) is repeatedly provided to the electrodes of the sensor. When an object contacts the sensor, coupling between the object and the electrodes increases the current drawn on the electrodes which increases the apparent sensor capacitance, and this increase in sensor capacitance may be detected. For example, if an increase in capacitance is detected while a drive signal is applied to electrode row 2 and electrode column 3, then the location of a touch may be row 2, column 3. Interpolation techniques may be used to identify locations between nodes. Nodes may be scanned sequentially by sequencing through combinations of rows and columns of electrodes.

Drive signals (i.e., the AC stimulus) described above is one cause of EME. Capacitance is typically measured synchronously with the drive signals. So, there is a direct relationship between the sampling rate of a measurement and frequency of emission of EME.

Electromagnetic emissions (EME) is meant to broadly include energy transmitted in electromagnetic waves of an electromagnetic field (EMF) that propagates through space (e.g., electromagnetic radiation (EMR)), and [noise] energy transmitted in a current conducted through a material (e.g., conducted emissions).

Emissions measurements is meant to broadly include any measurable value that is indicative of EME. Measurement equipment may make use of techniques for wireless measurements of EME caused by a device (i.e., no physical connection between measurement equipment and a device), techniques for wired measurements of EME caused by a device (i.e., at least one physical connection between measurement equipment and a device, such as a wire), or techniques that use a combination of techniques for wireless measurements and techniques for wired measurements.

EME of a touch sensor, and more specifically, one or more arrays of electrodes that form a touch sensor, can exceed EME limits for certain applications. As the area of N by M touch sensors increases, so does the EME of the touch sensors. EMR of a touch sensor are the propagating (i.e., radiating) waves of an electromagnetic field (EMF), which waves carry electromagnetic radiant energy.

Figure 1:
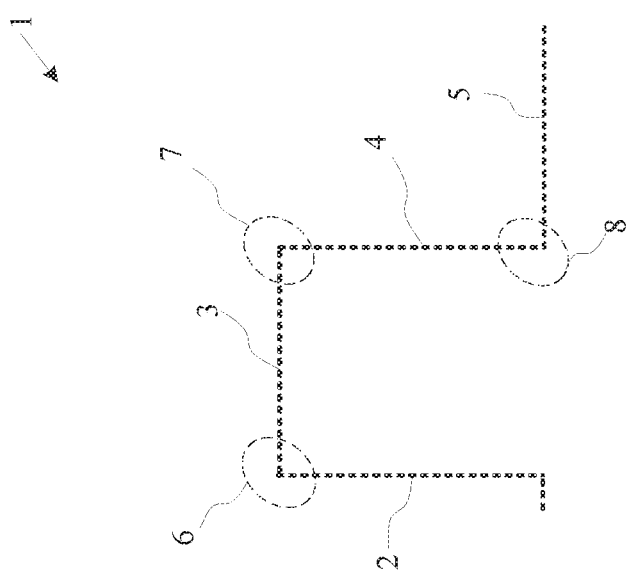
FIG. 1 shows a period of an example square waveform.

Among other things, the waveform of a reference signal used by a driver of a touch sensor may affect the amount of EMR given off by a touch sensor during sensing operation. Sharp transitions from one edge to another of a waveform create harmonics that increase EMR. FIG. 1 shows a period of an example square waveform 1 that includes rising edge 2, top edge 3, falling edge 4, and bottom edge 5. The transitions 6, 7 and 8 correspond to increased EMR. FIG. 1 is a simple example. FIG. 2 shows an example square waveform 10 that is a DAC approximation. The transition between edges as well as the transitions between monotonic portions that form the edges of square waveform 10 contribute to EMR.

Edges of waveforms can be shaped to control harmonics and therefore the EMR that such harmonics create. A conventional technique for shaping waveforms in touch sensors is to use passive filters, but using specific hardware ties each touch sensor to a specific solution that may not meet EME limits for different applications or meet limits for the same application but in different countries. For example, a touch sensor with passive filters used in an application with radio frequency (RF) antennas nearby in Europe may not meet the EME limits for the same application in the United States, nor might it meet EME limits for an application with RF antennas using different frequency bands.

Moreover, there is a trade-off in sensing speed when passive filters are used to shape waveforms of driver reference signals. Sensing speed is how quickly a touch processor can identify contact with a touch sensor. Sensing speed is affected by acquisition rate, which is how often a touch processor can measure the capacitance on the electrodes of a touch sensor (acquisition rate is also referred to herein as "sampling rate"). The higher the acquisition rate the faster the sensing speed. Best acquisition rates are achieved when a driver reference signal has a flat top, but passive filters provide signals with a waveform that has a downward sloping top—not a flat top.

Finally, passive filtering techniques known to the inventors of this disclosure do not compensate for the non-linearities in the touch sensor drivers.

So, the inventors of this disclosure appreciate a need for waveform shaping techniques without some or all of the disadvantages of passive filtering techniques.

Figure 3A:
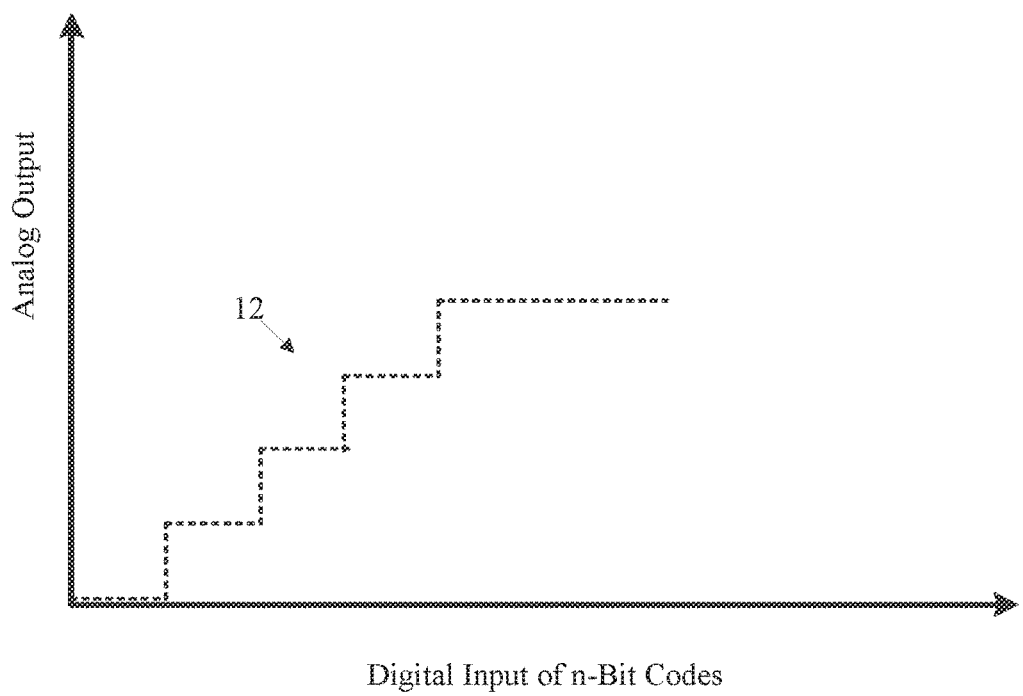
FIG. 3A shows an example edge of a waveform of a signal output from a DAC, where the waveform is monotonic-increasing.
Figure 3B:
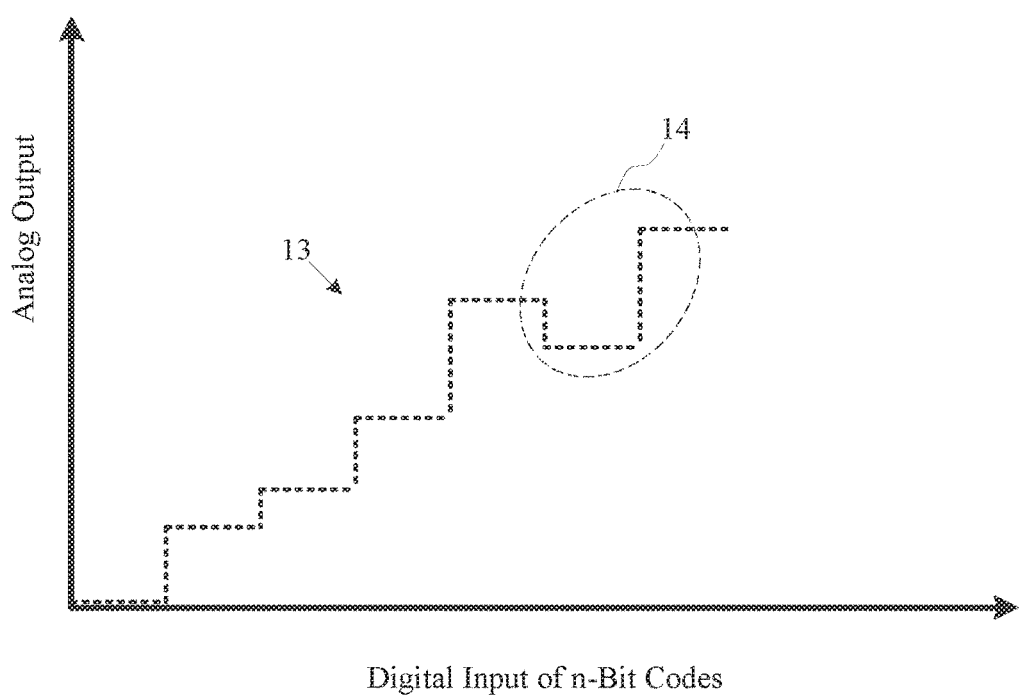
FIG. 3B shows an example edge of a waveform of a signal output from a DAC, where the waveform includes a non-monotonic portion.

Non-monotonic portions of a waveform can be used to control harmonics and therefore EMR of a driver reference signal. FIG. 3A, shows an example edge 12 of a DAC outputted waveform, where the edge 12 may be characterized as monotonic-increasing. FIG. 3B shows an example edge 13 of a DAC outputted waveform, where the edge 13 includes a portion 14 that may be characterized as non-monotonic, and so edge 13 is also characterizable as non-monotonic. In this disclosure, waveforms that have intentionally introduced non-monotonic portions are referred to as "arbitrary waveforms" and the signals that have such waveforms are referred to as "arbitrary signals."

There is a need for waveform shaping techniques that can be used to create arbitrary waveforms for a reference signal of a touch sensor driver in order to control harmonics, and to control EME more generally.

Some disclosed embodiments relate, generally, to shaping a waveform of a reference signal used by a driver of a touch sensor to limit EME emitted by a touch sensor during a sensing operation. In disclosed embodiments, shaping may be performed for one or more frequency bands of sampling frequencies usable for sensing operations. Shaping may be performed on a portion of a waveform of a reference signal or on an entire waveform. One or more shapes may be selected that are detected to correspond to EME below a pre-defined limit (or within a pre-defined range) for one or more frequency bands. N-bit digital codes (also referred to herein as "n-bit codes") may be stored that correspond to selected shapes. In some embodiments, selected shapes may be arbitrary shapes. In some embodiments, selected shapes may include non-monotonic and/or monotonic portions and at least some n-bit codes of sequences of n-bit codes may correspond such portions.

It should be appreciated that disclosed embodiments have many advantages and benefits, including but not limited to those described herein. For example, in some disclosed embodiments, electromagnetic radiation caused, at least in part, by known and unknown non-linearities of DACs usable to generate reference voltages for drivers may be overcome.

In disclosed embodiments, a shape of a waveform (i.e., a "waveform shape") of a driver reference signal may be described in terms of a shape of the waveform of a driver reference signal output by a DAC and/or a sequence of n-bit codes applied to a DAC to generate a signal having such a shape.

Figure 4:
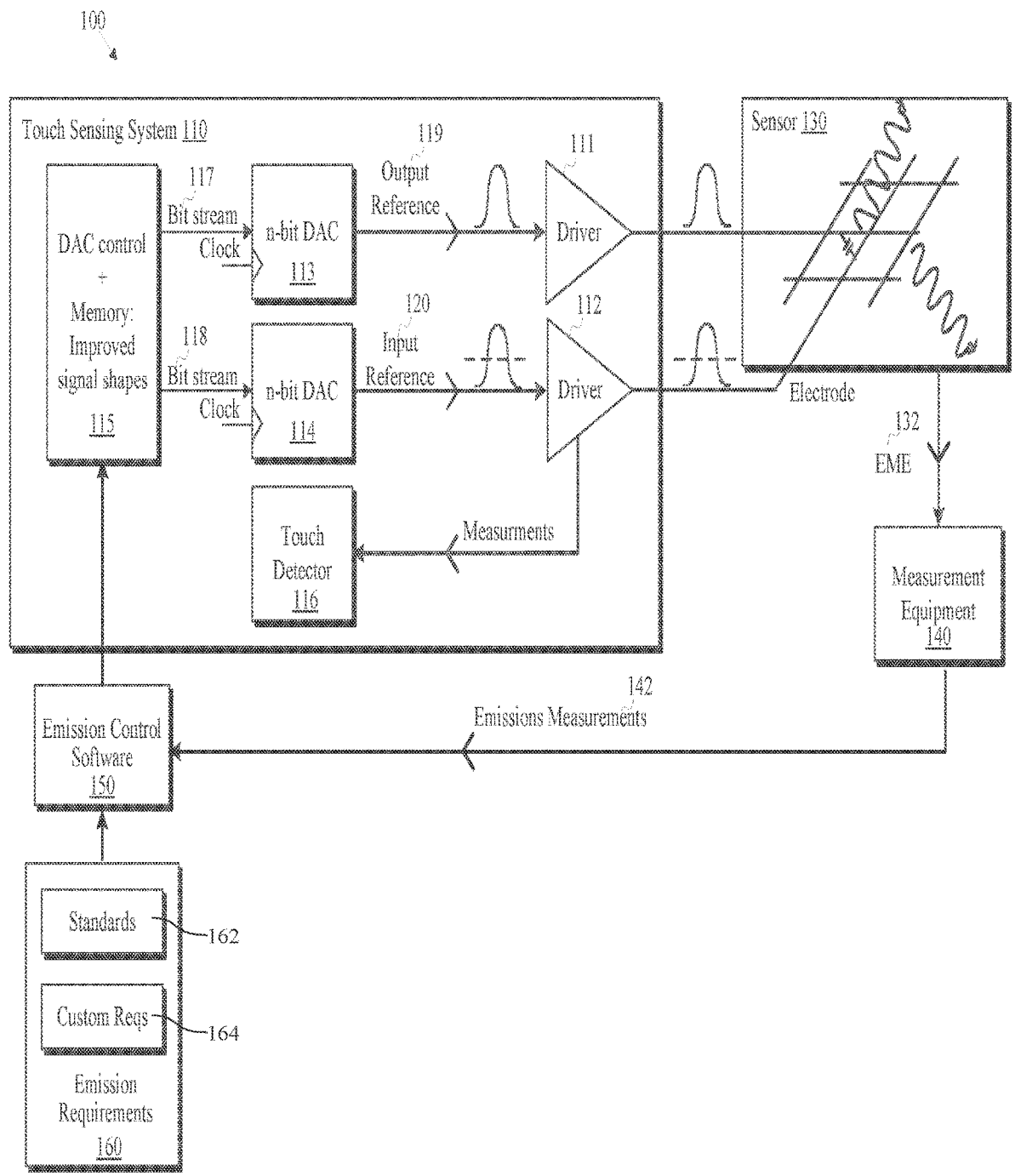
FIG. 4 shows a system for configuring a touch sensing system to control for EME, in accordance with disclosed embodiments.

FIG. 4 shows an embodiment of a system 100 for configuring a touch sensing system 110 to control for EME. System 100 may include touch sensing system 110, touch sensor 130, measurement equipment 140, emission control software 150, and emission requirements 160. Touch sensing system 110 is configured, generally, to measure capacitances at touch sensor 130 and detect and report touches responsive to those measurements.

Touch sensing system 110 may include DAC referenced drivers 111 and 112, n-bit DACs 113 and 114, DAC control 115, and touch detector 116. N-bit DACs 113 and 114 are configured to receive bit-streams 117 and 118, respectively, and output driver reference signals 119 and 120, respectively, responsive to the bit-streams 117 and 118. In the example shown in FIG. 4, reference signals 119 and 120 are labeled as output reference 119 and input reference 120 because this example uses separate drivers for rows and columns of electrodes of touch sensor 130. In other embodiments different numbers of drivers may be used than in this example, including one driver or more than two drivers.

DAC control 115 is configured to provide bit-streams 117 and 118 to n-bit DACs 113 and 114, respectively. In disclosed embodiments, bit-streams 117 and 118 correspond to signal shapes. DAC control 115 may store bit-streams of signal shapes in memory (not shown). For example, if using a 4-bit DAC, then DAC control 115 stores a sequence of 4-bit codes and that sequence of 4-bit codes corresponds to a waveform having a desired shape. DAC control 115 may store a first sequence of n-bit codes to cause n-bit DAC 113 to generate reference signal 119, and store a second sequence of n-bit codes to cause n-bit DAC 114 to generate reference signals 120.

In the example shown in FIG. 4, DAC control 115 controls both n-bit DACs 113 and 114. In another embodiment, touch sensing system 110 may include multiple DAC control modules, for example, each n-bit DAC may be controlled (i.e., receive a bit-stream) from a dedicated DAC control module.

Measurement equipment 140 is configured, generally, to measure EME 132 emitted from touch sensor 130. More specifically, measurement equipment 140 is configured to measure EME 132 emitted from touch sensor 130 during sensing operations and to provide emissions measurements 142 corresponding to EME 132 during sensing operations to emission control software 150. Measurement equipment 140 may include any suitable sensor(s) for directly or indirectly measuring EME 132, for example, spectrum analyzers, Gauss meters, EMF meters, multimeters for measuring body voltage, E-field sensors, and/or H-field sensors. Emission control software 150 is configured, generally, to analyze emissions measurements 142 corresponding to a sensing operation and based on those results, evaluate the sequence of n-bit codes and therefore the shape of the driver reference signals 119 and 120 used during the sensing operation. For example, emission control software 150 may evaluate a sequence of n-bit codes by comparing emissions measurements 142 to applicable EME requirements 160. If emissions measurements 142 are below the applicable limits, then the sequence of n-bit codes may be stored by DAC control 115. If emissions measurements 142 exceed the applicable limits, then the emission control software 150 may provide a new sequence of n-bit codes for a new signal shape to DAC control 115 for testing. The process of selecting a sequence of n-bit codes, performing sensing operations, measuring EME 132, and evaluating the sequence of n-bit codes based on measured EME 132 and emissions requirements 160, may be repeated until an acceptable signal shape is identified.

Emissions requirements 160 may include standards 162 and/or custom requirements 164. By way of example, standards 162 may be an automotive standard such as CISPR25 which is a standard for controlling electromagnetic interference in electrical and electronic devices used in automotive applications. Custom requirements 164 may be anything, including for example customer requirements, requirements that exceed standards, and requirements for applications where there are no standards or no industry-accepted standards.

Figure 5:
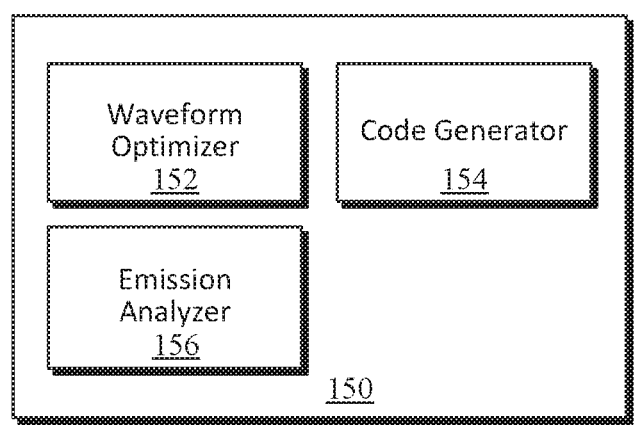
FIG. 5 shows an emission control software, in accordance with disclosed embodiments.

FIG. 5 shows an embodiment of emission control software 150 that includes waveform optimizer 152, code generator 154, and emissions analyzer 156. Waveform optimizer 152 is configured, generally, to determine changes to a shape of a waveform to, in theory, improve EME emitted from touch sensor 130 during a sensing operation. In one embodiment, waveform optimizer 152 may select changes based on an optimization algorithm, and more specifically, according to an output of a cost function as described more fully, below. It should be understood that disclosed embodiments do not require that an actual change in shape of a waveform determined by waveform optimizer 152 actually be optimal.

Code generator 154 is configured, generally, to generate a sequence of n-bit codes that correspond to the shapes of the waveforms selected by waveform optimizer 152. Emissions analyzer 156 is configured, generally, to analyze the emissions measurements 142 from measurement equipment 140 and determine how EME emitted from touch sensor 130 compares to various emissions requirements.

In disclosed embodiments, any suitable global optimization algorithm may be used to find a waveform shape that improves EME. In one embodiment, each sequence of n-bit codes that are tested is a parameter for a global optimization algorithm. In some cases a list of sequences of n-bit codes may be long and so an optimization algorithm may wander for an excessive period of time, so in one embodiment, a smaller number of parameters may be used to represent a waveform in addition to, or as an alternative to, using a list of sequences of n-bit codes. For example, a waveform may be represented as a polynomial evaluated at different instants, and the parameters for the global optimization algorithm are the coefficients of the polynomial at a given instant. By way of another example, a waveform may be represented as splines, Bezier curves, or coefficients of a Taylor series, which allows complex shapes to be represented with a limited list of parameters.

Figure 6:
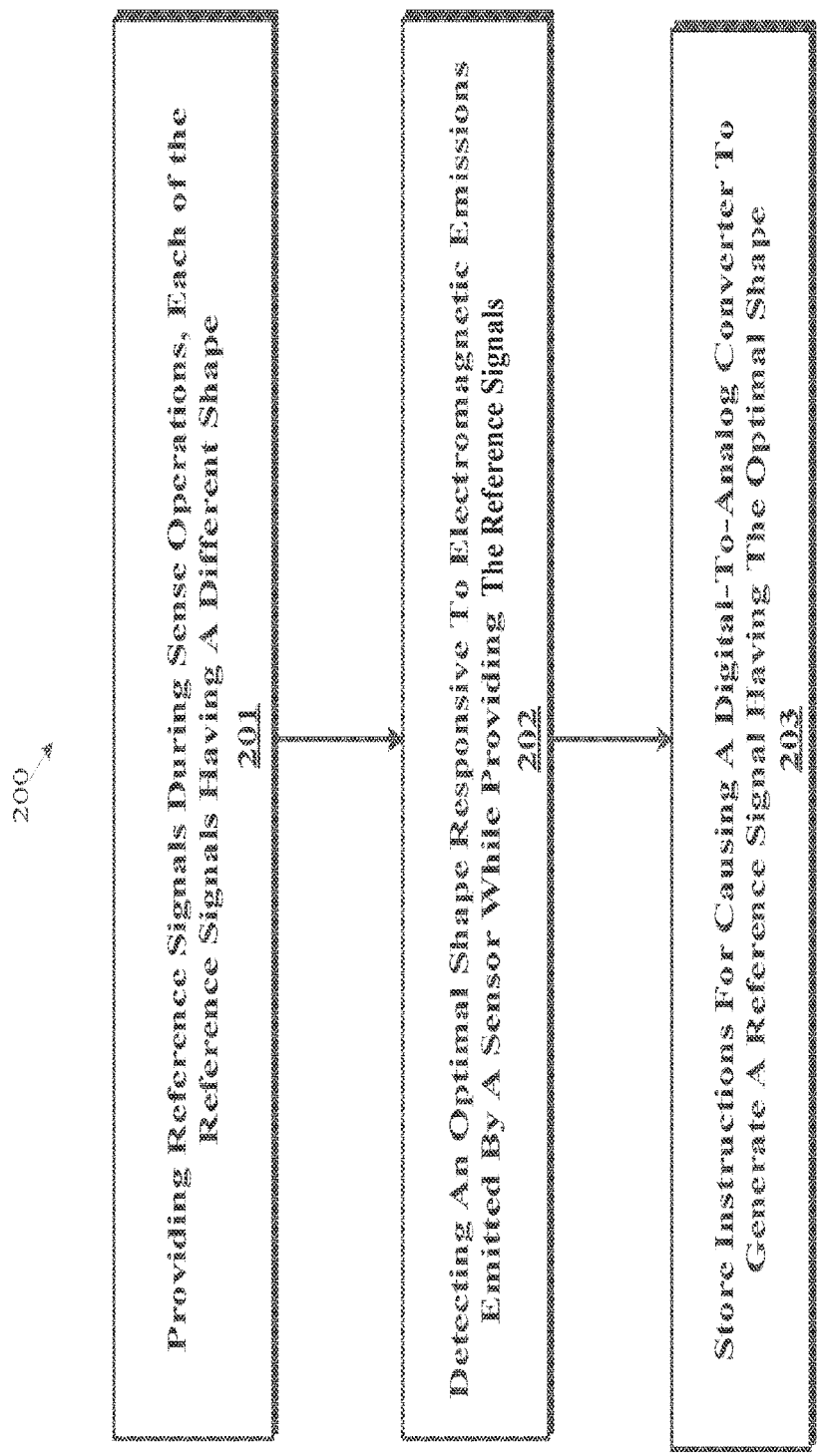
FIG. 6 shows a process for configuring a touch sensing system (such as touch sensing system of FIG. 4) to control for EME, in accordance with disclosed embodiments.

FIG. 6 shows a process 200 for configuring a touch sensing system (such as touch sensing system 110) to control for EME, in accordance with disclosed embodiments. In operation 201, reference signals are provided to a driver during a number of sensing operations. Each of the reference signals provided during different sensing operations has a different shape. In other words, a reference signal provided during a first sensing operation has a different shape than a reference signal provided during a subsequent sensing operation. In operation 202, an optimal shape for a reference signal is detected responsive to EME emitted by a touch sensor while providing the reference signals. In one embodiment, an optimal shape for a reference signal may be detected because it is the first shape that is below an applicable EME limit. In another embodiment, an optimal shape for a reference signal may be detected because it corresponds to the lowest EME measurement of a number of shapes that were tested (i.e., the shape corresponds to a minimum EME measurement). In one embodiment, an optimal shape for a reference signal may be detected because it corresponds to the lowest EME measurement of a number of shapes that were tested that were below an EME limit. In operation 203, instructions are stored for causing a DAC to generate a reference signal having the optimal shape. The instructions may be or include sequences of n-bit codes that correspond to the optimal shape.

Figure 7:
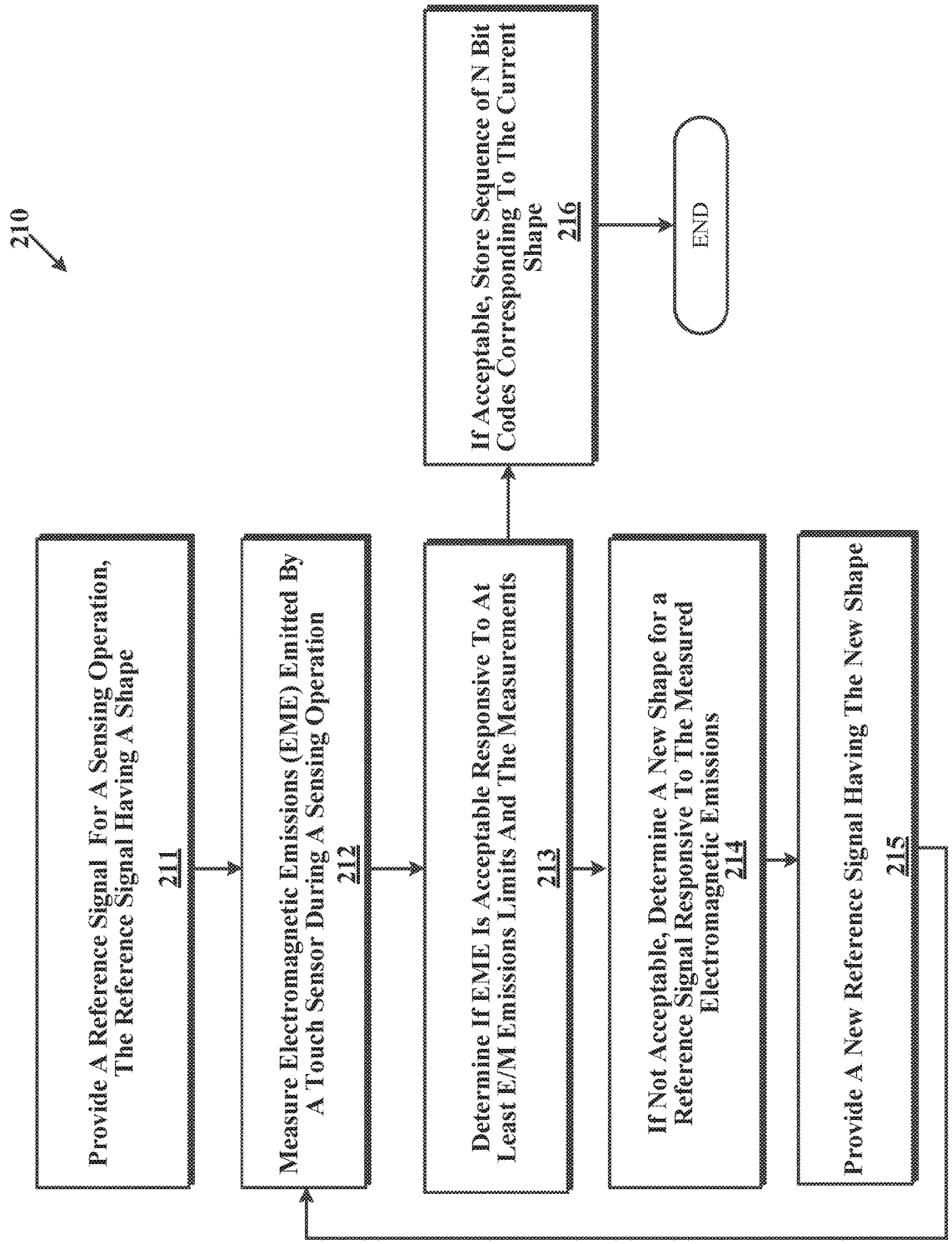
FIG. 7 shows a process for evaluating EME at a touch sensor for a particular shape of a reference signal, in accordance with disclosed embodiments.

FIG. 7 shows a process 210 for evaluating EME at a touch sensor for a particular shape of a reference signal, in accordance with disclosed embodiments. In operation 211, a driver reference signal is provided for a sensing operation, the reference signal having a pre-selected shape. In operation 212, EME emitted by a touch sensor during the sensing operation is measured. In operation 213, if EME is acceptable because the EME measurements are below applicable limits, then in operation 216 the sequence of n-bit codes corresponding to the current shape of reference signal is stored and process 210 ends. If not acceptable, in operation 214, a new shape for a reference signal is selected responsive to the measured EME, and in operation 215, a new reference signal for a driver is provided having the new shape, and operation 212 is again performed.

Figure 8:
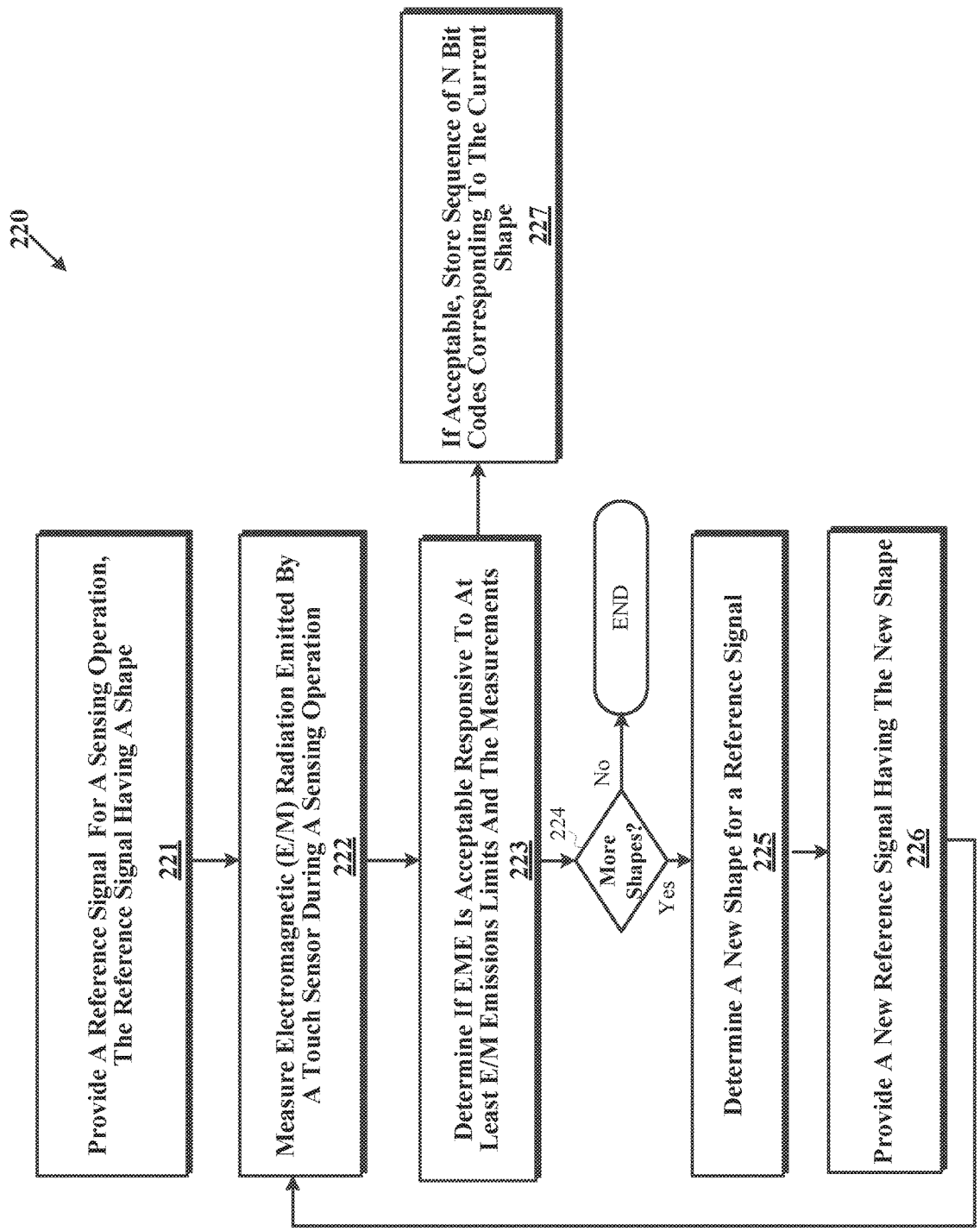
FIG. 8 shows a process for collecting a list of acceptable shapes that may be analyzed to determine a shape of a waveform that minimizes EME at a touch sensor, in accordance with disclosed embodiments.

FIG. 8 shows a process 220 for collecting a list of acceptable signal shapes that may be analyzed to determine the signal shape that improves EME at a touch sensor, in accordance with disclosed embodiments. In operation 221, a driver reference signal is provided for a sensing operation, the reference signal having a pre-selected signal shape. In operation 222, EME emitted by a touch sensor during the sensing operation is measured. In operation 223, if EME is acceptable because the EME measurements are below applicable limits, then in operation 227 the sequence of n-bit codes corresponding to the current shape of reference signal is stored.

In operation 224, a determination is made whether there are more signal shapes to test, and if not, then process 220 ends. In one embodiment, the tested signal shapes may be a set of pre-selected signal shapes and process 220 ends if all the pre-selected signal shapes have been tested.

In another embodiment, a cost function may be used, and process 220 ends when a shape that minimizes the cost function is found. A cost function may analyze an emission measurement and return an output which values compliance of EME against an emissions requirements.

If more signal shapes should be tested, then in operation 225, a new signal shape for a reference signal is selected, and in operation 226, a new reference signal for a driver is provided having the new signal shape. If there are multiple sequences of n-bit codes stored, then a sequence of n-bit codes that has the lowest EME may be selected.

Figure 9:
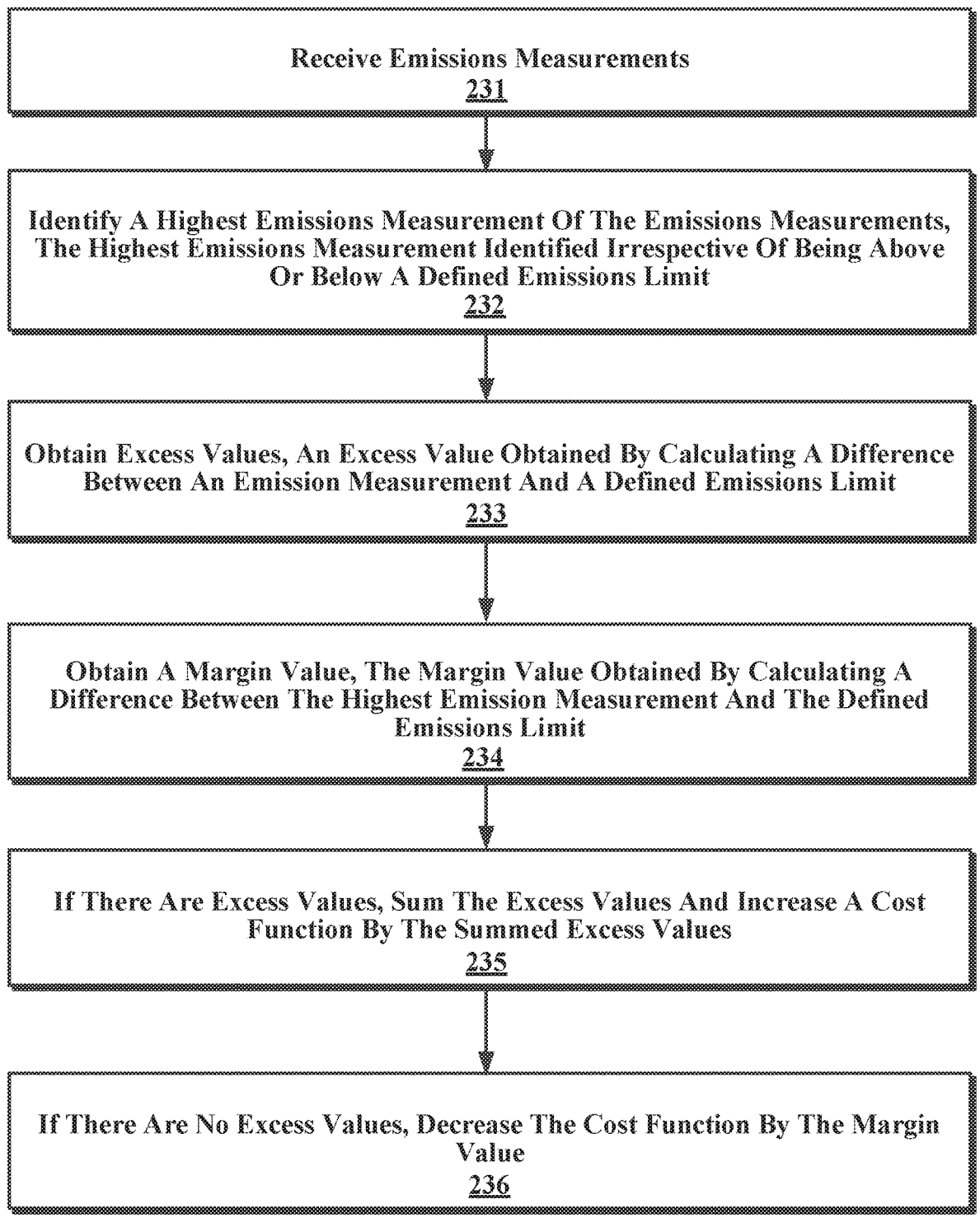
FIG. 9 shows a process for obtaining a cost function, in accordance with disclosed embodiments.

FIG. 9 shows a flow chart of a process 230 for obtaining a cost function such as a cost function used in process 220, in accordance with disclosed embodiments. In embodiments of FIG. 9, a cost function may return a lower value to represent improving compliance with an emissions requirement and return a higher value to represent worsening compliance with an emissions requirement. In other embodiments, other conventions may be used.

In operation 231, a number of emissions measurements are received. The emissions measurements may correspond to a particular waveform shape. In operation 232, a highest emissions measurement of the emissions measurement is identified. The highest emissions measurement may be identified notwithstanding it being above or below a defined emissions limit.

In operation 233, excess values are obtained and stored. For each of the excess values, an excess value may be obtained by calculating a difference between each emission measurement of operation 231 and a defined emission limit.

In operation 234, a margin value is obtained and stored. The margin value may be obtained by calculating a difference between the highest emissions measurement identified in operation 232 and the defined emissions limit. In operation 235, the excess values are summed and the summed excess values are used to increase the cost function. If there are no excess values, then in operation 236, the margin value is used to decrease the cost function.

Other embodiments may additionally or alternatively obtain a cost function by subtracting the margin value from the summed excess values, and using the result to either increase or decrease the cost function (depending on if the result is positive or negative).

In some embodiments, an emissions requirement may define emission limits in several frequency bands and a process such as process 230 may be used to determine a cost function associated with a waveform shape for each of the frequency bands. In other embodiments, an emissions requirement may define several frequency bands and for each frequency band define emission limits for different measurement methodologies, and process such as process 230 may be used to determine a cost function associated with a waveform shape for each combination frequency band and measurement methodology. For example, an emissions requirement may divide a spectrum into an RFID band, a long wave (LW) band, and a medium wave (MW) band; and for each frequency band define emission limits for peak (PK), quasi peak (QP), and/or average (AV) emissions. So, for each combination of frequency band of interest and measurement methodology, a cost function may be determined.

In some embodiments, a configuration process (such as processes 200, 210 and 220) may be performed multiple times for different sampling rates that have different fundamental frequencies. Multiple sequences of n-bit codes may be stored, where each sequence of n-bit codes is associated with a signal shape that optimizes EME for a particular sampling rate/fundamental frequency. Some advantages of storing multiple sequences of n-bit codes for different fundamental frequencies are described with reference to FIGS. 10 and 11.

Some disclosed embodiments relate, generally, to a DAC referenced touch sensor driver and controlling an amount of EME emitted at a touch sensor. More specifically, a DAC is controlled to generate a shaped reference signal that has a waveform shaped to control an amount of EME emitted at a touch sensor to meet EME limits. Such limits may be, for example, defined by standard or customized for a particular application in which a touch sensing system is used.

Figure 10:
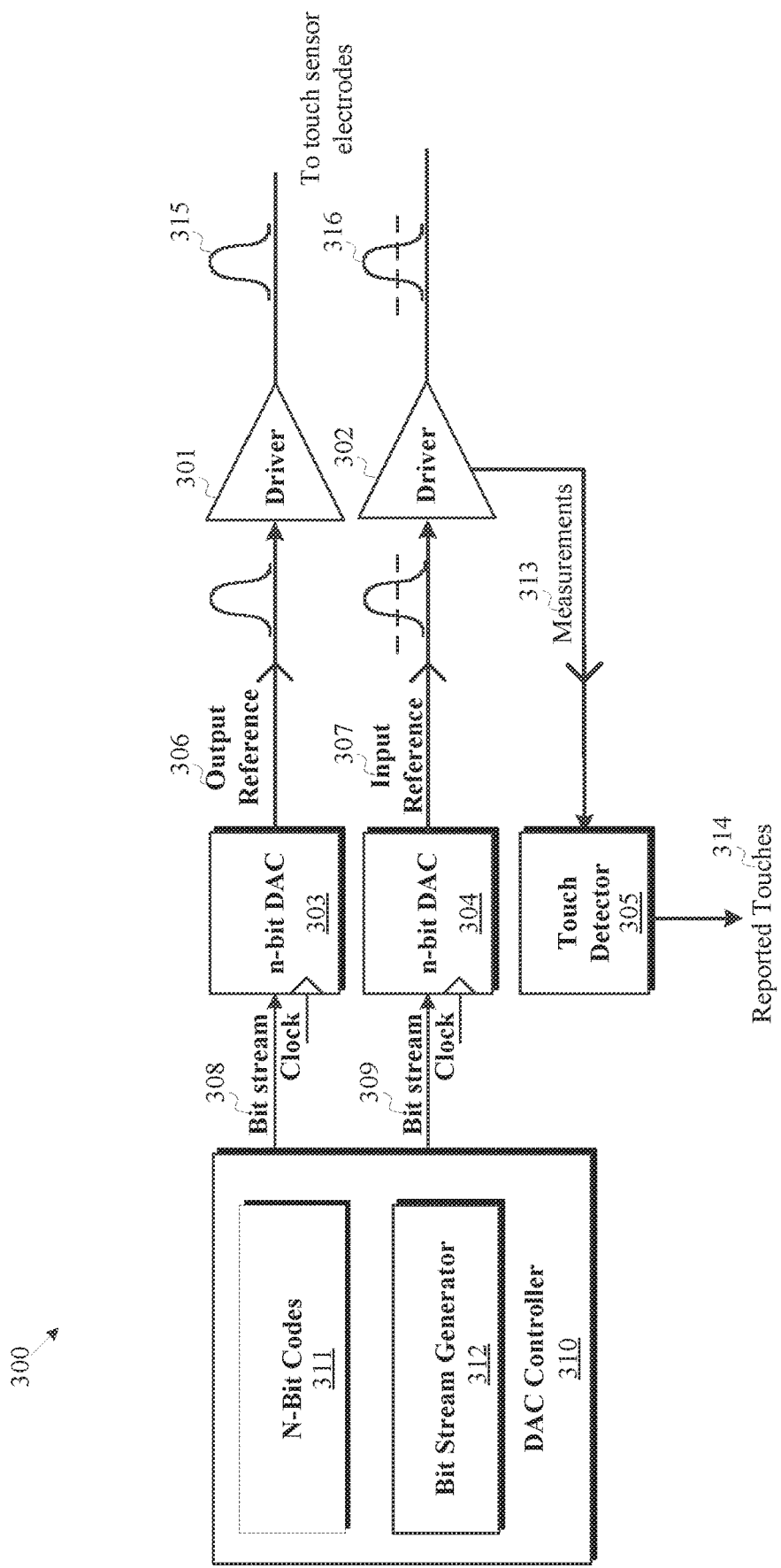
FIG. 10 shows a touch sensing system configured to provide driver reference signals that are shaped to control for EME emitted by a touch sensor, in accordance with disclosed embodiments.

FIG. 10 shows an embodiment of a touch sensing system 300 configured to provide reference signals 306 and 307 that are shaped to control EME emitted by a touch sensor according to disclosed embodiments. In the example shown in FIG. 10, touch sensing system 300 is configured, generally, to perform self-capacitance sensing techniques. Touch sensing system 300 may include drivers 301 and 302, n-bit DACs 303 and 304, and touch detector 305. Touch controller 310 has stored n-bit codes 311 that correspond to improved shapes for reference signals 306 and 307. Bit-stream generator 312 is the logic that enables DAC controller 310 to generate bit-streams 308 and 309 that cause n-bit DACs 303 and 304 to output reference signals having improved shapes, in cooperation with a received clock signal. More specifically, bit-stream generator 312 may control the rate at which bit-streams 308 and 309 are provided to n-bit DACs 303 and 304 based on, for example, a desired sampling rate used by touch sensing system 300. Drivers 301 and 302 may output drive signals 315 and 316 for driving electrodes of a touch sensor (not shown), respectively, responsive to reference signals 306 and 307, respectively.

Touch detector 305 is configured to measure 313 signal levels of drive signal 316 and detect changes in the signal level caused by contact at a touch sensor operatively coupled to touch sensing system 300. More specifically, touch detector 305 may detect an increase in the current cause by apparent additional capacitance from an object contacting a touch sensor. Touch detector 305 reports a touch 314 if it detects a change in the signal level that meets or exceeds a threshold.

While, in the example system shown in FIG. 10, touch detector 305 is shown measuring 313 drive signal 316, disclosed embodiments are not so limited. Touch detector 305 may also measure 313 drive signal 315 to detect a touch, or measure 313 both drive signal 315 and drive signal 316 to detect a touch. While the example system shown in FIG. 10 includes two drivers 301 and 302, it should be appreciated that other numbers of drivers may be used to provide drive signals to a touch sensor, for example, one driver or more than two drivers. While the example system shown in FIG. 10 is configured to perform self-capacitance sensing techniques, and contemplated operations described herein have been described with reference to self-capacitance sensing, disclosed embodiments are not so limited. In another embodiment, touch sensing system 300 may be configured for mutual capacitive sensing, where drive signals and sense signals are provided to a touch sensor responsive to shaped reference signals, and touch detector 305 is configured to measure sense signals to detect touches at the touch sensor.

In some cases, a frequency of a sampling rate may cause a measurement to be susceptible to foreign noise, but a different frequency may not cause a measurement to be susceptible or as susceptible to the foreign noise. Some disclosed embodiments relate, generally, to compensating for effects of foreign noise at a touch sensor. In disclosed embodiments, a sampling rate may be changed from a first sampling rate to a second sampling rate responsive to foreign noise. More specifically, in disclosed embodiments, a sampling rate may be changed to a second sampling rate that is less susceptible (i.e., influenced by) the foreign noise than the first sampling rate. The first sampling rate may be associated with a first fundamental frequency and the second sampling rate may be associated with a second fundamental frequency. A shape of a reference signal usable by a driver may be changed responsive to the second fundamental frequency.

Figure 11:
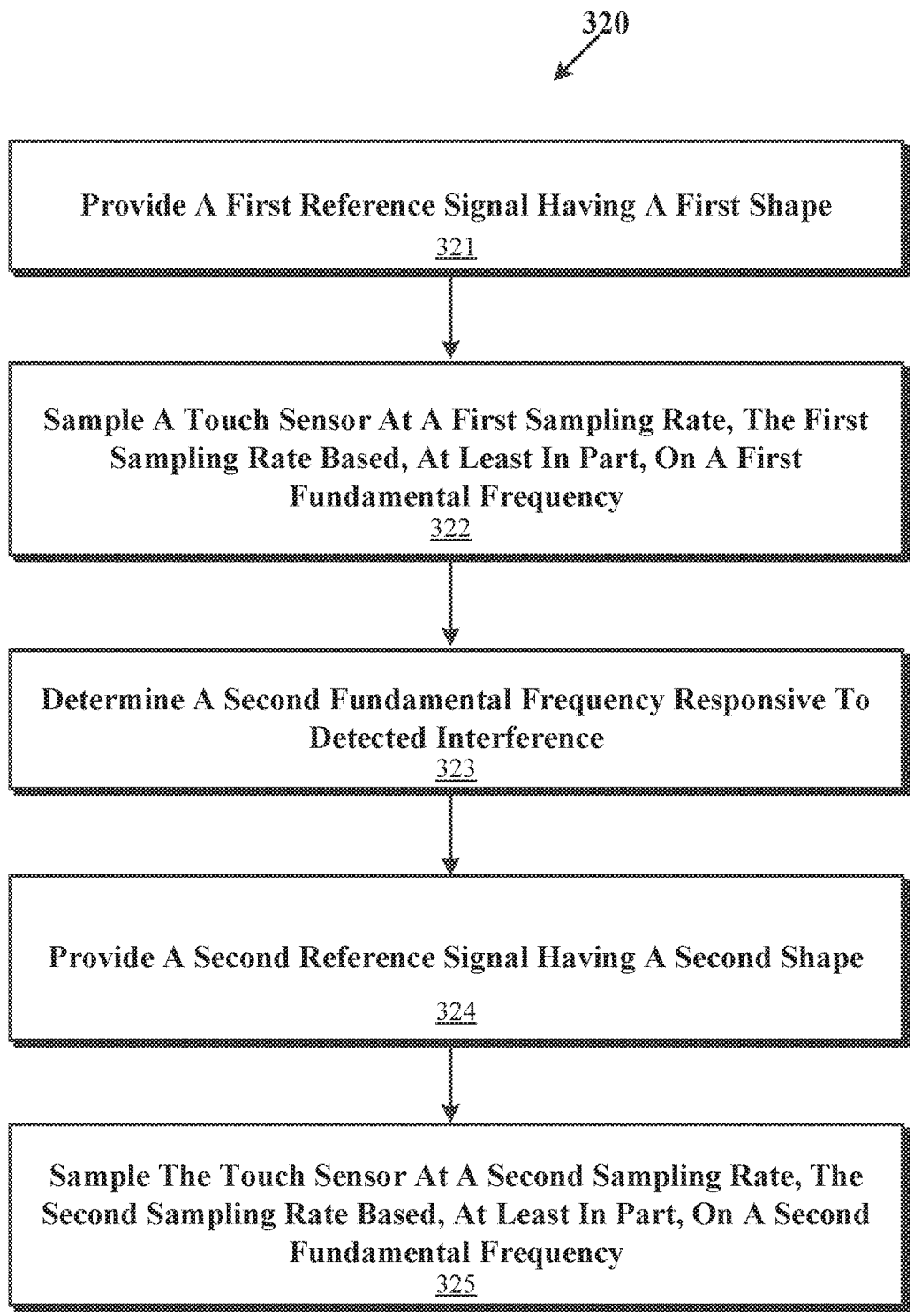
FIG. 11 shows a process for compensating for foreign noise that utilizes different reference signal shapes, in accordance with disclosed embodiments.

FIG. 11 shows an embodiment of a process 320 for compensating for foreign noise that utilizes different reference signal shapes. In operation 321, a first driver reference signal is output. The driver reference signal has a first shape which it corresponds to a first fundamental frequency for a first sampling rate. In operation 322 a touch sensor is measured at the first sampling rate, which is associated with the first fundamental frequency. In operation 323, a second fundamental frequency is determined responsive to a detected interference. In one embodiment, a second sampling rate is determined that reduces susceptibility to the foreign noise and the second fundamental frequency is determined based on the second sampling rate. In one embodiment, the second fundamental frequency and second sampling rate may be one of a number of predetermined fundamental frequencies and predetermined sampling rates, respectively, that have a predetermined association. In operation 324, a second reference signal for a driver is provided. The second reference signal has a second shape, different than the first shape, and the second shape is associated with the second fundamental frequency. In operation 325, the touch sensor is sampled at a second sampling rate, which is associated with the first fundamental frequency.

Figure 12:
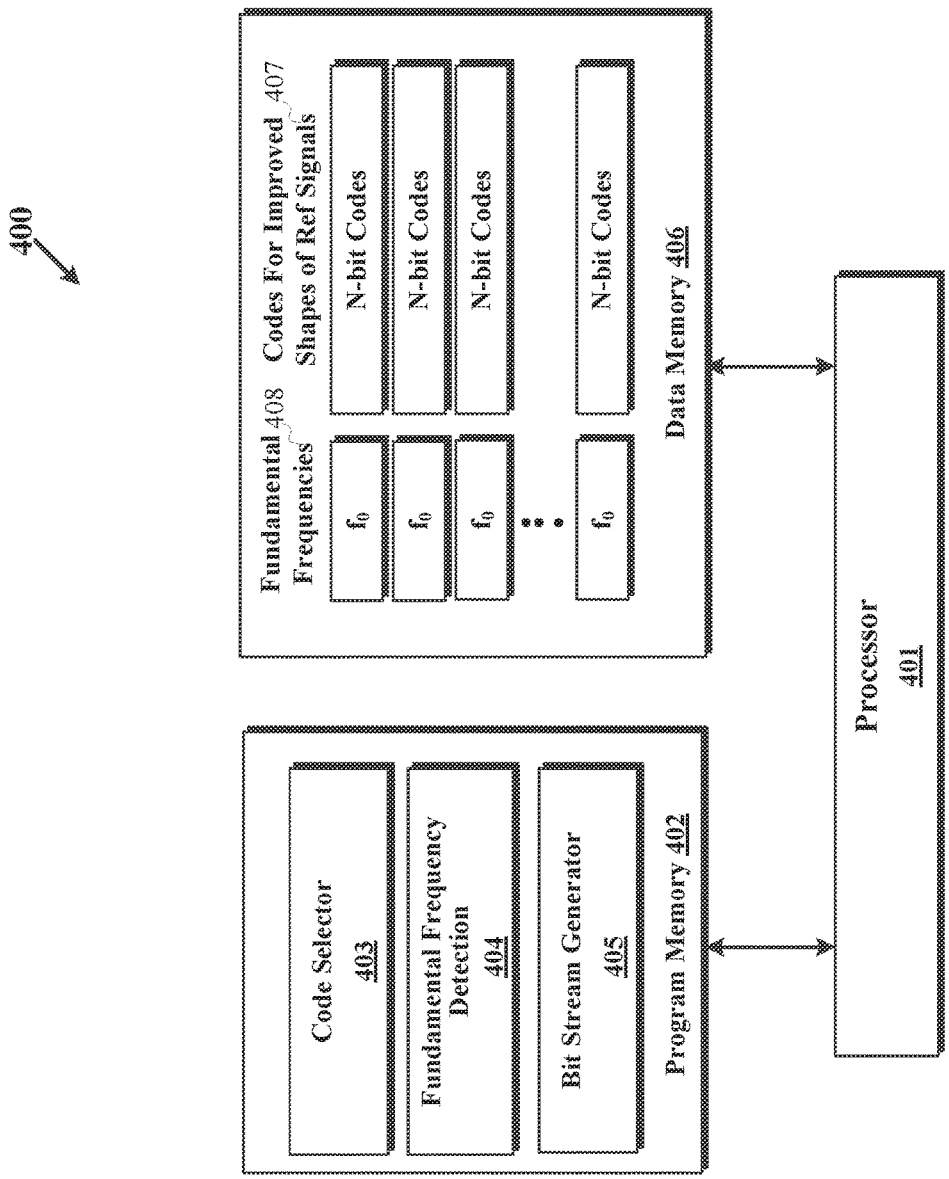
FIG. 12 shows a DAC controller that is configured to change a shape of a waveform of a reference signal responsive to a touch sensing system changing a sampling rate (e.g., to compensate for foreign noise by), in accordance with disclosed embodiment.

FIG. 12 shows an embodiment of a DAC controller 400 that is configured to change the shape of a reference signal responsive to a touch sensing system changing a sampling rate (e.g., to compensate for foreign noise). DAC controller 400 includes a processor 401, a program memory 402 and a data memory 406 (the data memory 406 could just be part of the program memory depending on the implementation). Program memory 402 is configured to store programs for various applications related to performing disclosed embodiments, including controlling a DAC to change the shape of a reference signal. In this example, code selector 403, fundamental frequency detection 404, and bit-stream generator 405 are stored at program memory 402. Data memory 406 is configured to store sequences of n-bit codes 407 for improved shapes of reference signals. Each stored sequence of n-bit codes 407 is associated with a particular fundamental frequency, $f_0$, 408. In one embodiment, the sequences of n-bit codes 407 and fundamental frequencies 408 may be stored as a look-up-table (LUT), and the LUT may be searchable using values for the fundamental frequencies 408, sampling rates corresponding to the fundamental frequencies $f_0$, or some other key.

In a contemplated operation of DAC controller 400, fundamental frequency detection 404 determines that a sampling rate has changed for example, because bit-stream generator 405 has changed the bit-stream rate to accommodate a new sampling rate. Fundamental frequency detection 404 determines a fundamental frequency associated with the new sampling rate. Code selector 403 uses the fundamental frequency to select a sequence of n-bit codes from among sequences of n-bit codes 407 stored on data memory 406. In another embodiment, code selector 403 may use a new sampling rate determined based on the bit stream rate of the bit-stream generator 405 (in which case the fundamental frequency detection 404 may be omitted). Code selector 403 provides the selected sequence of n-bit codes to bit-stream generator 405 to generate the bit-streams for the DACs.

For some applications, EME requirements may be so stringent that not all EME limits may be met by a single fundamental frequency and waveform shape. Stated another way, multiple EME limits may be associated with a certain application, and no single fundamental frequency and waveform shape combination may be found that does not result in undesirable harmonics—i.e., harmonics that cause a touch system to exceed at least one of the EME limits.

For example, in a contemplated application, EME limits may be enforced for RFID, LW and MW bands. A touch system operating with a given fundamental frequency and waveform shape may be able to respect (i.e., meet) EME limits for RFID and LW, but exceeds EME limits for MW. Alternatively, the touch system using a different fundamental and waveform shape or the same fundamental and a different waveform shape may be able to respect EME limits for RFID and MW, but exceed EME limits for LW. In other words, in this example, a fundamental and shape is found that would satisfy EME limits for RFID and LW; a fundamental and shape is found that would satisfy EME limits for RFID and MW; but no fundamental and shape is found that would satisfy EME limits for RFID, MW, and LW.

So, some disclosed embodiments relate, generally, to an emissions control circuitry, and a touch sensing systems including the same, that is configured to perform dynamic selection of touch sensing fundamental frequency and/or waveform shape for a touch sensing system based, at least in part, on system-level use information and qualitative EME information. System level use information may be, for example, information about a current state of other devices in an application system of which a touch sensing system is a part, or system-level use information may be instructions about how to prioritize EME limits (e.g., prioritize MW limits over LW limits).

Qualitative EME information is qualitative characterizations of associated fundamental frequencies and waveform shapes and/or information that could be used to characterize, qualitatively, associations of fundamental frequencies and waveform shapes—in terms of EME. Qualitative EME information may include for various pairs of fundamental and waveform shape, for example, information about harmonics, information about EME limits for specific bands and/or regions, information about whether specific EME limits are satisfied or have been tested, or any other information that could be used to determine whether EME limits relevant to an application system could be met by a given fundamental and waveform shape. Satisfied EME limits may be expressed, for example, as EME levels that might result during operation, satisfied portions of the spectrum (e.g., LW, MW, and RHD), and satisfied limits for specific geographic region (e.g., North America, South America, and Europe). Information about satisfied EME limits may also include information about EME limits that are not satisfied, broken down, for example, by geographic region or bands.

Figure 13:
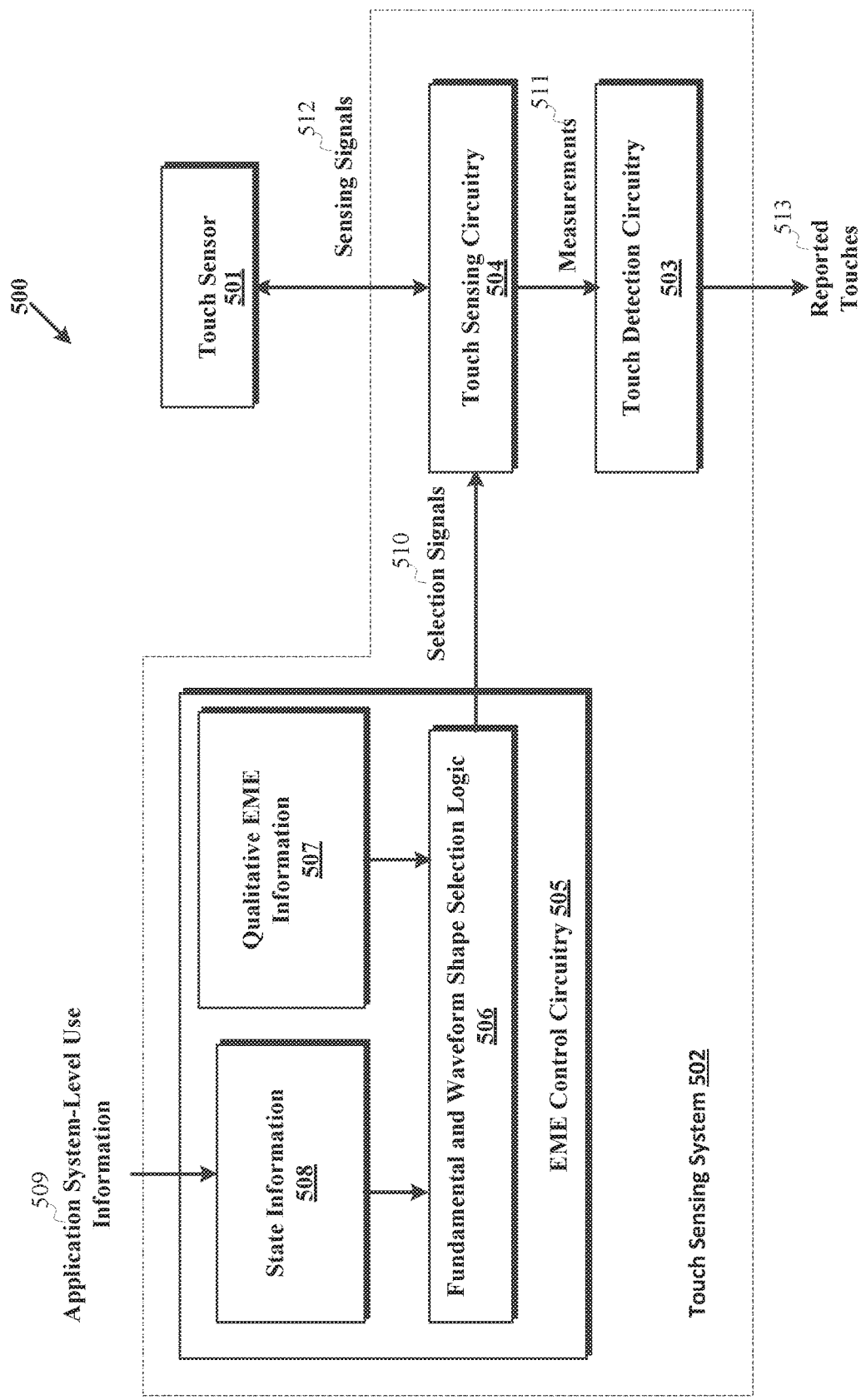
FIG. 13 shows an EME control circuitry that is part of or operates in conjunction with a touch sensing system, in accordance with disclosed embodiments.

FIG. 13 shows an EME control circuitry 505 that is part of or operates in conjunction with a touch sensing system 502, in accordance with disclosed embodiments. In disclosed embodiments, touch sensing system 502 may include touch detection circuitry 503, touch sensing circuitry 504, and EME control circuitry 505; and is part of touch system 500 that also includes touch sensor 501. In the embodiment shown in FIG. 13, touch system 500 is a sub-system that is part of a more encompassing application system that may include other devices and/or components (not shown). Touch sensing circuitry 504 may be configured to provide and receive sensing signals 512 (e.g., drive signals) to touch sensor 501, and touch detection circuitry 503 may be configured to report touches 513 responsive to measurements 511 based on sensing signals 512.

In disclosed embodiments, EME control circuitry 505 may be configured, generally, to monitor a state of an application system and control operation of touch sensing circuitry 504 in order to meet certain EME requirements. EME control circuitry 505 may be configured to store (e.g., in data memory, registers, a buffer, and combinations thereof) state information 508 about a broader application system and qualitative EME information 507 about improved fundamentals and associated waveform shapes, select fundamentals and/or waveform shapes based, at least in part, on stored state information 508 and qualitative EME information 507, and provide selection signals 510 responsive to the selected fundamentals and/or waveforms.

In one embodiment, EME control circuitry 505 may be configured to receive system-level use information 509 about an application system and store state information 508 based, at least in part, on the received system-level use information 509. In one embodiment, an application system may provide system-level use information 509 to touch system 500. For example, an application system may provide as system-level use information 509: information about other devices in the system, information about EME limits associated with those devices, and/or information about application specific settings, such as region settings (e.g., North America, South America, or Europe). In one embodiment, EME control circuitry 505, touch sensing system 502, or touch system 500 more generally, may include a communications link or communications protocol to collect or receive system-level use information 509 from an application system, for example, from a computer, sub-system, or stack of the application system.

For example, if an application system includes multiple radio transmitters and receivers, system-level use information 509 may include information about which bands and/or frequencies the radios are configured to receive/transmit and/or which bands and/or frequencies are actually being received/transmitted by the radios.

In the embodiment shown in FIG. 13, fundamentals and associated waveform shapes (e.g., sequences of n-bit code)

may be stored with qualitative EME information 507 or in another memory location (not shown) accessible by selection logic 506. Indeed, in the embodiment shown in HG. 13, EME control circuitry 505 may be, or be part of, a DAC controller (such as DAC controller 310 shown in FIG. 10) for controlling a DAC (not shown, but such as DAC 303 or 304 of FIG. 10), and selection signals 510 may be, e.g., driver reference signals. In another embodiment, EME control circuitry 505 may be a separate module (i.e., separate from a DAC controller) and configured to provide selection signals 510 to a DAC controller that is part of touch sensing circuitry 504. For example, EME control circuitry 505 may be configured to provide information to a DAC controller about a selected fundamental and shape having favorable EME characteristics, and such DAC controller may then select a sequence of n-bit codes that corresponds to the information provided by EME control circuitry 505.

EME control circuitry 505 may include fundamental and waveform shape selection logic 506 configured to dynamically select a fundamental and waveform shape based, at least in part, on state information 508 and qualitative EME information 507. In one embodiment, fundamental and waveform shape selection logic 506 may be configured to monitor the state information 508 and detect changes to state information 508. If fundamental and waveform shape selection logic 506 detects a change, then fundamental and waveform shape selection logic 506 may be configured to select a fundamental and waveform shape based on qualitative information 507 and new state information 508 and provide selection signals 510 responsive to the selection.

Figure 14:
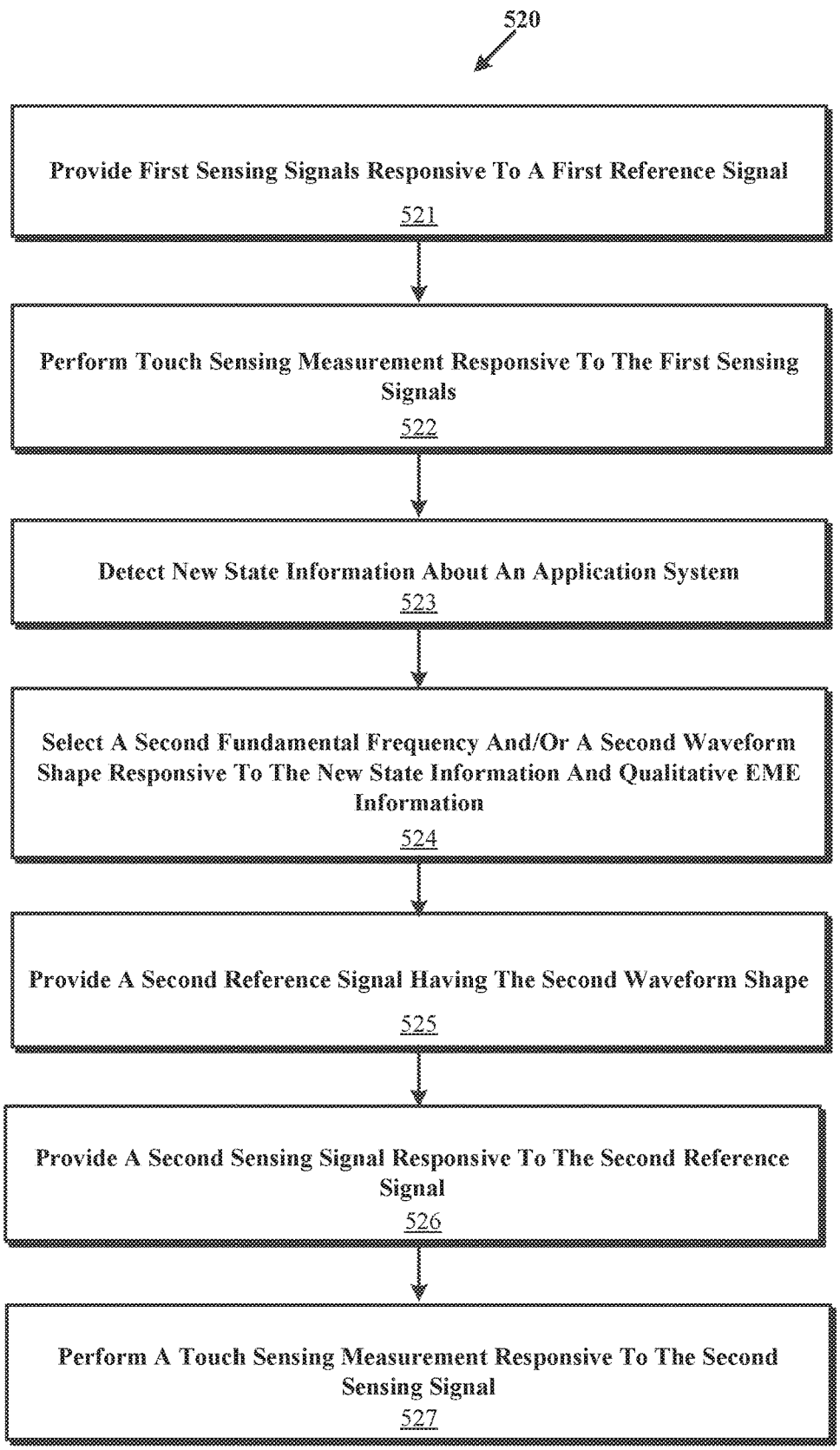
FIG. 14 shows a process for dynamically selecting a fundamental and waveform shape responsive to an application system, in accordance with disclosed embodiments.

FIG. 14 shows an embodiment of a process 520 for dynamically selecting a fundamental and waveform shape responsive to an application system.

In operation 521, a first sensing signals are provided responsive to a first reference signal. The first reference signal may have a shape corresponding to a first waveform shape associated with a first fundamental frequency. The first fundamental frequency and first waveform shape may have favorable EME characteristics for an application system as set forth in qualitative EME information characterizing the association of the first fundamental frequency and the first waveform. In operation 522, a touch sensing measurement is performed responsive to the first sensing signals. In one embodiment, the first sensing signals are drive signals and the touch sensing measurement is a self-capacitance measurement. In operation 523, new state information about the application system is detected. In operation 524, a second fundamental frequency and/or a second waveform shape are selected responsive to the new state information and qualitative EME information that characterizes associations of a number of pairs of fundamentals frequencies and waveform shapes including those selected. The second fundamental frequency and/or second waveform shape may be selected, for example, because qualitative EME information characterizes an association more favorably in terms of EME given the new state information than the first fundamental frequency and the first waveform shape (and preferably more favorably than other combinations of fundamental frequencies and waveform shapes that are available). The more favorable EME characteristics may be, for example, indications that fundamental frequencies and associated wave form shapes result in EME within EME limits for various devices within the application system or within a geographic regions where the application system is deployed.

In operation 525, a second reference signal is provided. The second reference signal has a second waveform shape, different than the first waveform shape. In operation 526, a second sensing signal is provided responsive to the second reference signal and, in operation 527, a touch sensor measurement is performed responsive to the second sensing signals.

One having ordinary skill in the art would understand that disclosed embodiments have many advantages and benefits. For example, enabling compliance with different electromagnetic emission limits based on a location of a radio antenna, based on a radio quality, based on a location of use (e.g., a country that has specific requirements related to EME, without limitation), and/or based on a presence of other equipment (e.g., audio system, remote entry equipment for an automobile, communication equipment, without limitation); enabling compliance with EME requirements for radio band (e.g., frequency band, without limitation) allocations world-wide; and the ability to control spectral content by software without using hardware passive filters.

By way of further example, disclosed embodiments enable adjustment of a DAC controller and a touch sensing system more generally, after manufacture and so may accelerate time to market by saving redesign cycles that are otherwise required for systems that use passive filters.

By way of yet further example, combining a DAC solution with tuning software (e.g., emission control software 150) may compensate for non-linearities in a driver stage that would otherwise cause signals at unwanted harmonics.

By way of yet further example, using software to control a DAC to generate shaped reference signals for a driver enables faster signal acquisition than other solutions such as hardware passive filters.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor(s).

Additional non-limiting embodiments of the disclosure include:

Embodiment 1: A touch sensing system, comprising: a digital-to-analog-converter (DAC) controller configured to output a code for a waveform shape, wherein the code or the waveform shape is associated with exhibiting electromagnetic emissions (EME) at the touch sensing system below a limit; a DAC configured to output a first shaped reference signal responsive to the code output by the DAC controller; a driver configured to provide a drive signal for a touch sensor responsive to the first shaped reference signal; and a touch detector configured to report touches responsive to a changed signal level of the drive signal.

Embodiment 2: The system according to Embodiment 1, wherein the DAC controller is configured to store sequences of n-bit codes, and wherein the code for the waveform shape output by the DAC controller is a bitstream comprising one of the stored sequences of n-bit codes.

Embodiment 3: The system according to any of Embodiments 1 and 2, wherein at least one other of the stored sequences of n-bit codes is associated with exhibiting EME at the touch sensing system below a different limit.

Embodiment 4: The system according to any of Embodiments 1 through 3, wherein the DAC controller is configured to store sequences of n-bit codes, and each of the stored sequences of n-bit codes is associated with different sampling rates.

Embodiment 5: The system according to any of Embodiments 1 through 4, wherein the DAC controller is configured to output a first code for a first waveform shape responsive to a first fundamental frequency and to output a second code for a second waveform shape responsive to a second fundamental frequency, wherein the first fundamental frequency is associated with a first sampling rate and the second fundamental frequency is associated with a second sampling rate.

Embodiment 6: The system according to any of Embodiments 1 through 5, wherein the DAC controller is configured to: provide a first bit stream based, at least in part, on a first sequence of n-bit codes corresponding to a shape of the first shaped reference signal; and provide a second bit stream based, at least in part, on a second sequence of n-bit codes corresponding to a shape of a second shaped reference signal.

Embodiment 7: The system according to any of Embodiments 1 through 6, wherein the DAC controller is configured to provide the first bit stream at a first rate associated with a first sampling rate, and provide the second bit stream at a second rate associated with a second sampling rate.

Embodiment 8: The system according to any of Embodiments 1 through 7, further comprising one or more memories, the one or more memories configured to store: sequences of n-bit codes for waveform shapes; qualitative electromagnetic emissions (EME) information characterizing associations of fundamentals and at least some of the sequences of n-bit codes; and state information about an application system.

Embodiment 9: The system according to any of Embodiments 1 through 8, wherein a first sequence of n-bit codes and a second sequence of n-bit codes are associated with the same fundamental frequency, and wherein the qualitative EME information comprises: a first characterization of harmonics of the fundamental frequency and first sequence of n-bit codes; and a second characterization of harmonics of the fundamental frequency and the second sequence of n-bit codes.

Embodiment 10: The system according to any of Embodiments 1 through 9, further comprising selection logic configured to select a sequence of n-bit codes of the sequences of n-bit codes responsive to the state information and the qualitative EME information.

Embodiment 11: A touch sensing method, comprising: providing a first code for a waveform shape for a digital-to-analog converter (DAC), wherein the first code or the waveform shape is associated with electromagnetic emissions (EME) at a touch sensing system below a limit; providing a first shaped reference signal for a driver responsive to the first code for the waveform shape; providing a drive signal for a touch sensor responsive to the first shaped reference signal; and reporting a touch responsive to a changed signal level of the drive signal.

Embodiment 12: The method according to Embodiment 11, wherein providing the first code for the waveform shape comprises providing a bitstream comprising a sequence of n-bit codes.

Embodiment 13: The method according to any of Embodiments 11 and 12, further comprising: measuring the drive signal at a first sampling rate; providing a second code for a waveform shape for the DAC responsive to detecting that a sampling rate has changed from a first sampling rate to a second sampling rate; providing a second reference signal for the driver responsive to the second code for the second waveform shape; providing a second drive signal for the touch sensor responsive to the second reference signal; and measuring the second drive signal at the second sampling rate.

Embodiment 14: The method according to any of Embodiments 11 through 13, wherein the second sampling rate is associated with less susceptibility to foreign noise than the first sampling rate.

Embodiment 15: The method according to any of Embodiments 11 through 14, further comprising: providing a first bitstream of the first code for the first waveform shape at a first rate associated with the first sampling rate; and providing a second bitstream of the second code for the second waveform shape at a second rate associated with the second sampling rate.

Embodiment 16: The method according to any of Embodiments 11 through 15, comprising: performing a first touch measurement responsive to the providing the drive signal; providing a second code for a second waveform shape for the DAC responsive to detecting that state information for an application system has changed; providing a second shaped reference signal for the driver responsive to the second code for the second waveform shape; providing a second drive signal for the touch sensor responsive to the second reference signal; and performing a second touch measurement responsive to providing the second drive signal.

Embodiment 17: The method according to any of Embodiments 11 through 16, further comprising determining that a harmonic associated with the second waveform shape has more favorable electromagnetic emissions (EME) characteristics responsive to the changed state information about the application system and qualitative EME information about harmonics associated with the second waveform shape.

Embodiment 18: A system for configuring a touch sensing system to control for electromagnetic emissions (EME), the system comprising: a touch sensing system configured to detect touches at a touch sensor responsive to sensed signals; and emissions control software that, when executed by a processor, is configured to: receive EME measurements obtained responsive to EME emitted by the touch sensor during a sensing operation; evaluate a shape of a reference signal used by the touch sensing system to detect the touches at the touch sensor responsive to the EME measurements and one or more emissions requirements; and configure the touch sensing system to use an improved shape for the reference signal used to detect touches, the improved shape corresponding to the EME measurements that is below the one or more emissions requirements.

Embodiment 19: The system according to Embodiment 18, wherein the shape of the improved shape is characterized by one or more of a substantially flat top edge, a rising edge having one or more non-monotonic portions, and a falling edge having one or more non-monotonic portions.

Embodiment 20: The system according to any of Embodiments 18 and 19, wherein the emissions control software is configured to select the improved shape responsive to detecting the improved shape minimizes EME with respect to other shapes of the reference signal.

Embodiment 21: The system according to any of Embodiments 18 through 20, wherein the touch sensing system is configured to store the improved shape for the reference signal.

Embodiment 22: The system according to any of Embodiments 18 through 21, wherein the one or more emissions requirements comprise emissions requirements defined by a standard.

Embodiment 23: The system according to any of Embodiments 18 through 22, wherein the one or more emissions requirements comprise emissions requirements defined by customer requirements.

Embodiment 24: The system according to any of Embodiments 18 through 23, further comprising an emissions measurement equipment configured to provide EME measurements responsive to EME exhibited by the touch sensor.

Embodiment 25: A method of configuring a touch sensing system to control for electromagnetic radiation (EME), the method comprising: providing reference signals for sensing operation, each of the reference signals having a different shape; detecting an improved shape for a reference signal responsive to measurements indicative of electromagnetic radiation (EME) emitted by a touch sensor during the sensing operations; and storing instructions for generating the reference signal having the optimal shape.

Embodiment 26: The method according to Embodiment 25, wherein the providing the reference signals during the sensing operation comprises: providing a first reference signal during a first sensing operation, the first reference signal having a pre-selected shape; receiving first EME measurements during the first sensing operation; determining that the first EME measurements is greater than an emissions requirement; providing a second reference signal during a second sensing operation, the second reference signal having a second shape; receiving second EME measurements during the second sensing operation; and determining that the second EME measurements are less than the emissions requirement.

Embodiment 27: The method according to any of Embodiments 25 and 26, further comprising selecting one of the first and the second shapes that corresponds to a lesser of the first and the second EME measurements.

Embodiment 28: The method according to any of Embodiments 25 through 27, further comprising: detecting that the first EME measurements are not less than the emissions requirements; determining changes to the first shape that might affect EME emitted by the touch sensor during a sensing operation; and selecting a sequence of n-bit codes corresponding to the second shape responsive to the determined changes.

Embodiment 29: The method according to any of Embodiments 25 through 28, wherein the selecting the sequence of n-bit codes corresponding to the second shape comprises selecting at least some n-bit codes of the sequence of n-bit codes that correspond to the determined changes to the first shape.

Embodiment 30: The method according to any of Embodiments 25 through 29, wherein the selecting at least some n-bit codes comprises selecting at least some n-bit codes that correspond to non-monotonic portions of the sequence of n-bit codes.

What is claimed is:

1. A touch sensing system, comprising:
a digital-to-analog-converter (DAC) controller configured to:
store sequences of n-bit codes, respective waveform shapes of the stored sequences of n-bit codes associated with differently exhibiting electromagnetic emissions (EME) at the touch sensing system; and
output one or more of the sequences of n-bit codes;
a DAC configured to output a first shaped reference signal responsive to a sequence of n-bit codes output by the DAC controller;
a touch-sensor driver configured to generate a drive signal for a touch sensor responsive to the first shaped reference signal; and
a touch detector configured to report touches responsive to a changed signal level of the drive signal.

2. A touch sensing system, comprising:
a digital-to-analog-converter (DAC) controller configured to:
store a first sequence of n-bit codes a first waveform shape of the first sequence of n-bit codes associated with a first sampling rate;
store a second sequence of n-bit codes, a second waveform shape of the second sequence of n-bit codes associated with a second sampling rate; and
output a bitstream of the first or second sequence of n-bit codes responsive to a sampling rate of the touch sensing system;
a DAC configured to output a first shaped reference signal responsive to the output of the first or second sequence of n-bit codes by the DAC controller;
a touch-sensor driver configured to generate a drive signal for a touch sensor responsive to the first shaped reference signal; and
a touch detector configured to report touches responsive to a changed signal level of the drive signal.

3. The system of claim 2, wherein the DAC controller is configured to output a first code for the first waveform shape responsive to a first fundamental frequency and to output a second code for the second waveform shape responsive to a second fundamental frequency, and
wherein the first fundamental frequency is associated with a first sampling rate and the second fundamental frequency is associated with a second sampling rate.

4. The system of claim 3, wherein the DAC controller is configured to:
provide a first bit stream based, at least in part, on a first sequence of n-bit codes corresponding to a shape of the first shaped reference signal; and
provide a second bit stream based, at least in part, on a second sequence of n-bit codes corresponding to a shape of a second shaped reference signal.

5. The system of claim 4, wherein the DAC controller is configured to provide the first bit stream at a first rate associated with a first sampling rate, and provide the second bit stream at a second rate associated with a second sampling rate.

6. A touch sensing system, comprising:
one or more memories, the one or more memories configured to store:
a first sequence of n-bit codes for a first waveform shape;
a second sequence of n-bit codes for a second waveform shape;
qualitative electromagnetic emissions (EME) information characterizing associations of fundamental frequencies and at least one of the first sequences and the second sequence; and
state information about an application system;
a digital-to-analog-converter (DAC) controller configured to output one of the first sequence and the second sequence;
a DAC configured to output a first shaped reference signal responsive to the sequence output by the DAC controller;

a touch-sensor driver configured to generate a drive signal for a touch sensor responsive to the first shaped reference signal; and
a touch detector configured to report touches responsive to a changed signal level of the drive signal.

7. The system of claim 6, wherein the first sequence of n-bit codes and the second sequence of n-bit codes are associated with the same fundamental frequency, and wherein the qualitative EME information comprises:
a first characterization of harmonics of the fundamental frequency and the first sequence of n-bit codes; and
a second characterization of harmonics of the fundamental frequency and the second sequence of n-bit codes.

8. The system of claim 6, further comprising selection logic configured to select a sequence of n-bit codes of the sequences of n-bit codes responsive to the state information and the qualitative EME information.

9. A touch sensing method, comprising:
selecting a first code of a number of stored codes, each of the number of stored codes for a respective waveform shape for a digital-to-analog converter (DAC);
providing the first code, wherein the first code for a first waveform shape is associated with electromagnetic emissions (EME) at a touch sensing system;
providing a first shaped reference signal for a touch-sensor driver responsive to the first code for the first waveform shape;
generating a drive signal for a touch sensor responsive to the first shaped reference signal; and
reporting a touch responsive to a changed signal level of the drive signal.

10. The method of claim 9, wherein providing the first code for the first waveform shape comprises providing a bitstream comprising a sequence of n-bit codes.

11. The method of claim 9, further comprising:
measuring the drive signal at a first sampling rate;
providing a second code for a second waveform shape for the DAC responsive to detecting that a sampling rate has changed from a first sampling rate to a second sampling rate;
providing a second reference signal for the driver responsive to the second code for the second waveform shape;
providing a second drive signal for the touch sensor responsive to the second reference signal; and
measuring the second drive signal at the second sampling rate.

12. The method of claim 11, wherein the second sampling rate is associated with less susceptibility to foreign noise than the first sampling rate.

13. The method of claim 11, further comprising:
providing a first bitstream of the first code for the first waveform shape at a first rate associated with the first sampling rate; and
providing a second bitstream of the second code for the second waveform shape at a second rate associated with the second sampling rate.

14. The method of claim 9, comprising:
performing a first touch measurement responsive to the providing the drive signal;
providing a second code for a second waveform shape for the DAC responsive to detecting that state information for an application system has changed;
providing a second shaped reference signal for the driver responsive to the second code for the second waveform shape;
providing a second drive signal for the touch sensor responsive to the second reference signal; and
performing a second touch measurement responsive to providing the second drive signal.

15. The method of claim 14, further comprising determining that a harmonic associated with the second waveform shape has more favorable electromagnetic emissions (EME) characteristics responsive to the changed state information about the application system and qualitative EME information about harmonics associated with the second waveform shape.

16. A system for configuring a touch sensing system to control for electromagnetic emissions (EME), the system comprising:
a touch sensing system configured to detect touches at a touch sensor responsive to sensed signals;
an emissions measurement equipment configured to provide EME measurements responsive to EME exhibited by the touch sensor; and
emissions control software that, when executed by a processor, is configured to:
receive the EME measurements;
evaluate a shape of a reference signal used by the touch sensing system to detect the touches at the touch sensor responsive to the EME measurements and one or more emissions requirements;
determine an improved shape for an waveform of the reference signal used to detect touches, the improved shape corresponding to the EME measurements that is below the one or more emissions requirements; and
configure the touch sensing system to use the improved shape.

17. The system of claim 16, wherein the shape of the improved shape is characterized by a substantially flat top edge, a rising edge having one or more non-monotonic portions, and a falling edge having one or more non-monotonic portions.

18. The system of claim 16, wherein the emissions control software is configured to select the improved shape responsive to detecting the improved shape decreases EME with respect to other shapes of the reference signal.

19. The system of claim 16, wherein the touch sensing system is configured to store the improved shape for the reference signal.

20. The system of claim 16, wherein the one or more emissions requirements comprise emissions requirements defined by a standard.

21. The system of claim 16, wherein the one or more emissions requirements comprise emissions requirements defined by customer requirements.

22. A method of configuring a touch sensing system to control for electromagnetic radiation (EME), the method comprising:
providing reference signals for a touch-sensor driver, for sensing operations, each of the reference signals having a different shape;
receiving measurements indicative of electromagnetic radiation (EME) emitted by a touch sensor during the sensing operations;
detecting an improved shape for a waveform of a reference signal responsive to the measurements; and
storing instructions for generating the reference signal having the improved shape.

23. The method of claim 22, wherein the providing the reference signals for the sensing operations and receiving the measurements comprises:
providing a first reference signal during a first sensing operation, the first reference signal having a first shape;

receiving first EME measurements during the first sensing operation;

determining that the first EME measurements are greater than an emissions requirement;

providing a second reference signal during a second sensing operation, the second reference signal having a second shape;

receiving second EME measurements during the second sensing operation; and determining that the second EME measurements are less than the emissions requirement.

24. The method of claim 23, further comprising selecting one of the first shape or the second shapes that corresponds to a lesser of the first and the second EME measurements.

25. The method of claim 23, further comprising:

detecting that the first EME measurements are not less than the emissions requirements;

determining changes to the first shape that might affect EME emitted by the touch sensor during a sensing operation; and selecting a sequence of n-bit codes corresponding to the second shape responsive to the determined changes.

26. The method of claim 25, wherein the selecting the sequence of n-bit codes corresponding to the second shape comprises selecting at least some n-bit codes of the sequence of n-bit codes that correspond to the determined changes to the first shape.

27. The method of claim 26, wherein the selecting at least some n-bit codes comprises selecting at least some n-bit codes that correspond to non-monotonic portions of the sequence of n-bit codes.

28. A touch sensing system, comprising:

a digital-to-analog-converter (DAC) controller configured to output a code for a waveform shape, wherein the waveform shape is associated with exhibiting electromagnetic emissions (EME) at the touch sensing system below a limit and wherein the waveform shape has been tuned to include a rising edge having one or more non-monotonic portions, a substantially flat top edge, and a falling edge having one or more non-monotonic portions;

a DAC configured to output a first shaped reference signal responsive to the code output by the DAC controller;

a touch-sensor driver configured to generate a drive signal for a touch sensor responsive to the first shaped reference signal; and a touch detector configured to report touches responsive to a changed signal level of the drive signal.

* * * * *

UNITED STATES PATENT AND TRADEMARK OFFICE
CERTIFICATE OF CORRECTION

PATENT NO. : 11,221,708 B2  
APPLICATION NO. : 16/379687  
DATED : January 11, 2022  
INVENTOR(S) : Fredrik Jonsson, Richard P. Collins and Lionel Nicolas Portmann Page 1 of 1

It is certified that error appears in the above-identified patent and that said Letters Patent is hereby corrected as shown below:

In the Specification  
        Column 14,    Line 9,    change "and RHD)," to --and RFID),--  
        Column 15,    Line 3,    change "HG. 13," to --FIG. 13,--

In the Claims  
    Claim 6,    Column 20,    Line 59,    change "first sequences and" to --first sequence and--

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*